United States Patent
Takahashi

[11] Patent Number: 6,101,369
[45] Date of Patent: Aug. 8, 2000

[54] RADIO PAGER

[75] Inventor: Satoshi Takahashi, Shizuoka, Japan

[73] Assignee: NEC Corporation, Tokyo, Japan

[21] Appl. No.: 09/095,999

[22] Filed: Jun. 11, 1998

[30] Foreign Application Priority Data

Jun. 13, 1997 [JP] Japan .................................. 9-157095

[51] Int. Cl.[7] ................................................. H04Q 7/14
[52] U.S. Cl. .................... 455/31.2; 455/182.2; 455/255; 455/257; 455/264
[58] Field of Search ............................. 455/182.2, 180.3, 455/180.4, 183.2, 255, 256, 257, 258, 259, 260, 264

[56] References Cited

U.S. PATENT DOCUMENTS

| | | | |
|---|---|---|---|
| 5,109,544 | 4/1992 | Mittel et al. ......................... | 455/182.2 |
| 5,263,195 | 11/1993 | Panther et al. ....................... | 455/182.2 |
| 5,564,091 | 10/1996 | Goldinger ............................ | 455/182.2 |
| 5,612,977 | 3/1997 | Ogoro ................................. | 455/182.2 |
| 5,633,898 | 5/1997 | Kishigami et al. ..................... | 375/344 |

Primary Examiner—Thanh Cong Le
Assistant Examiner—Yemane Woldetatios
Attorney, Agent, or Firm—Scully, Scott Murphy & Presser

[57] ABSTRACT

A radio pager having a frequency correcting function of the present invention includes an arithmetic section for determining, during an interval between the start and the end of a particular signal, a center amplitude based on the maximum and minimum values of the signal, producing a difference between the center amplitude and a reference voltage, and feeding back the resulting center voltage data to a quartz oscillation section or reference oscillation section. As a result, the oscillation frequency of the oscillation section is automatically corrected. This insures an accurate voltage amplitude and therefore accurate decision on a multilevel digital signal.

8 Claims, 22 Drawing Sheets

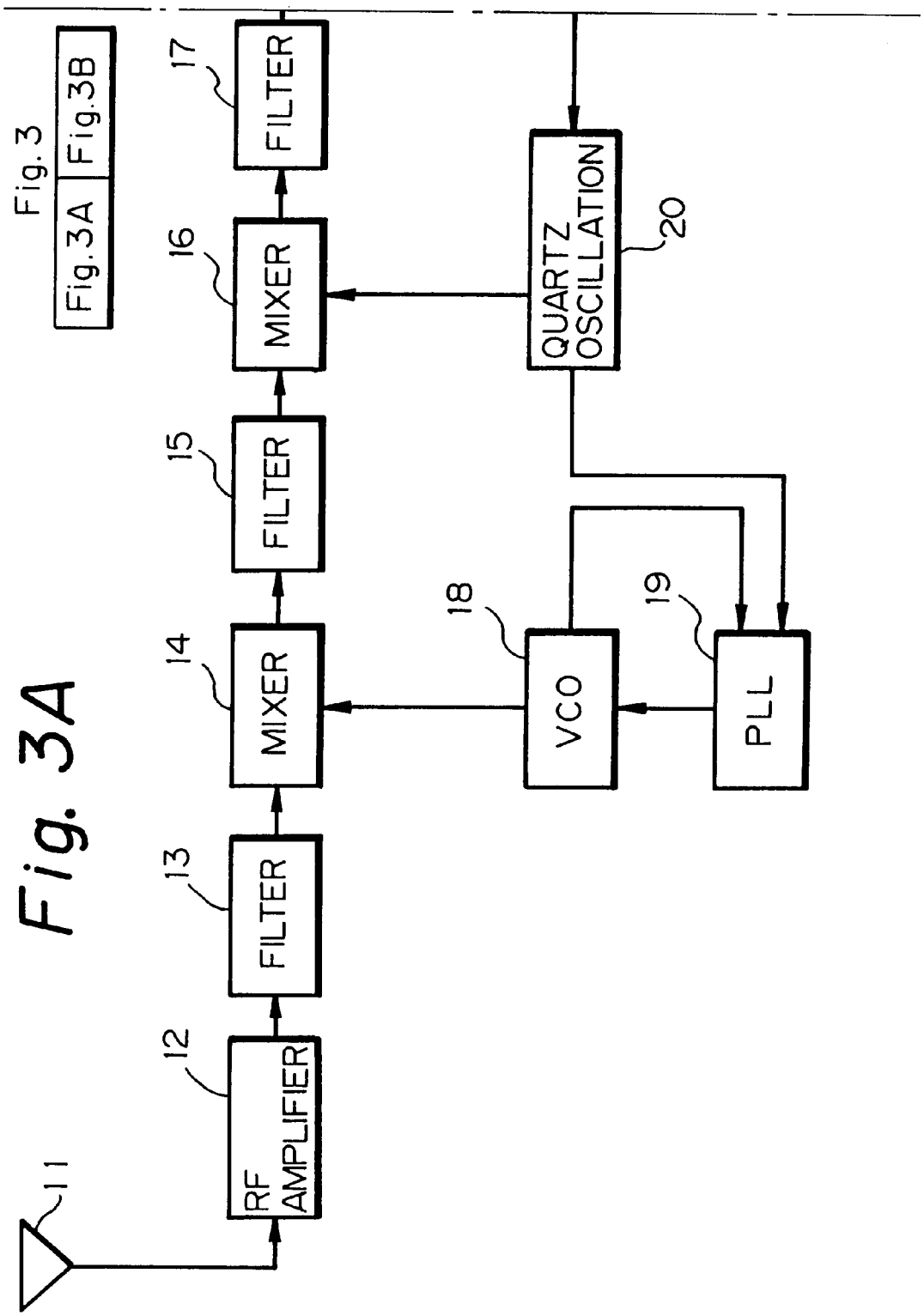

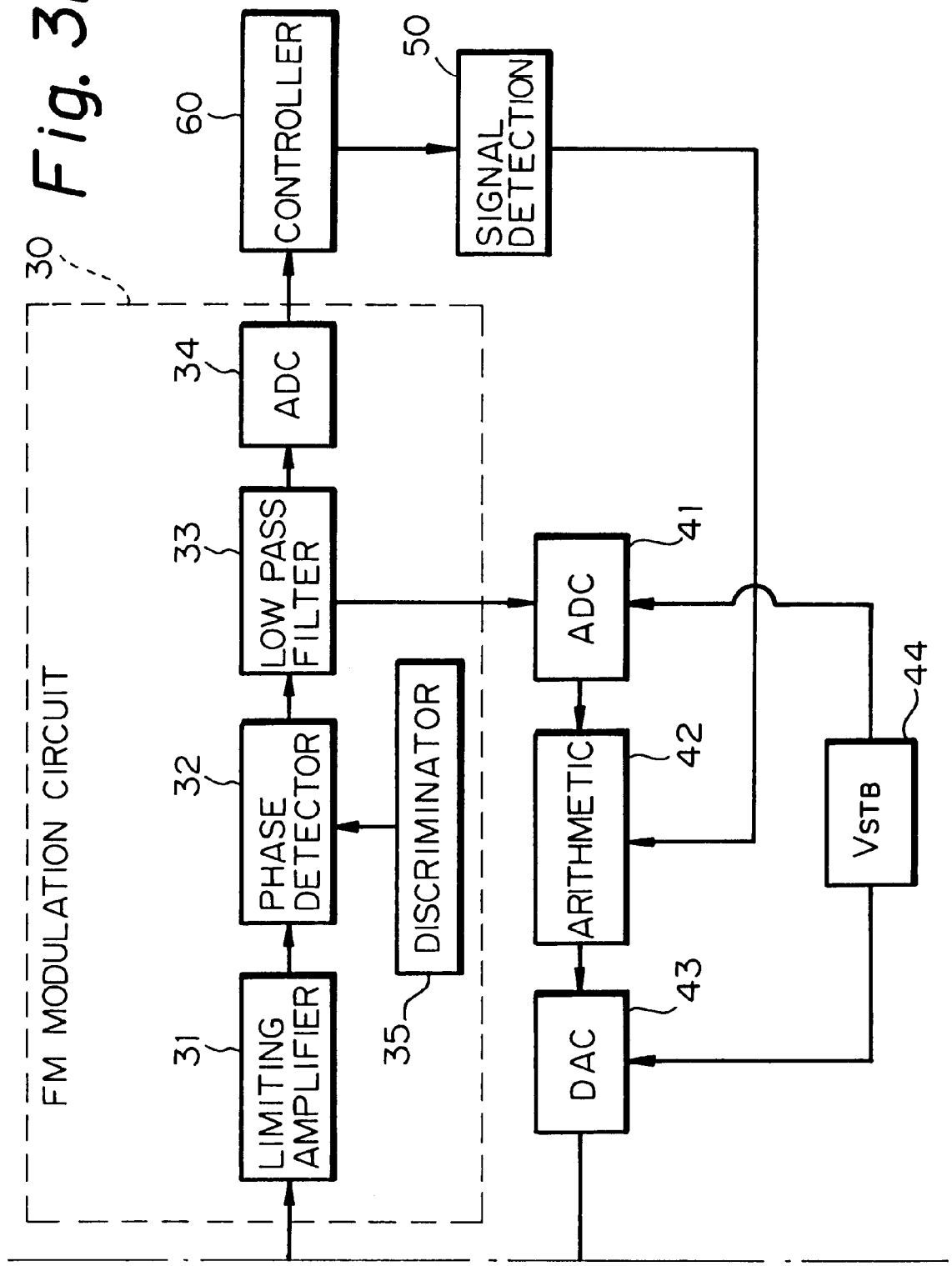

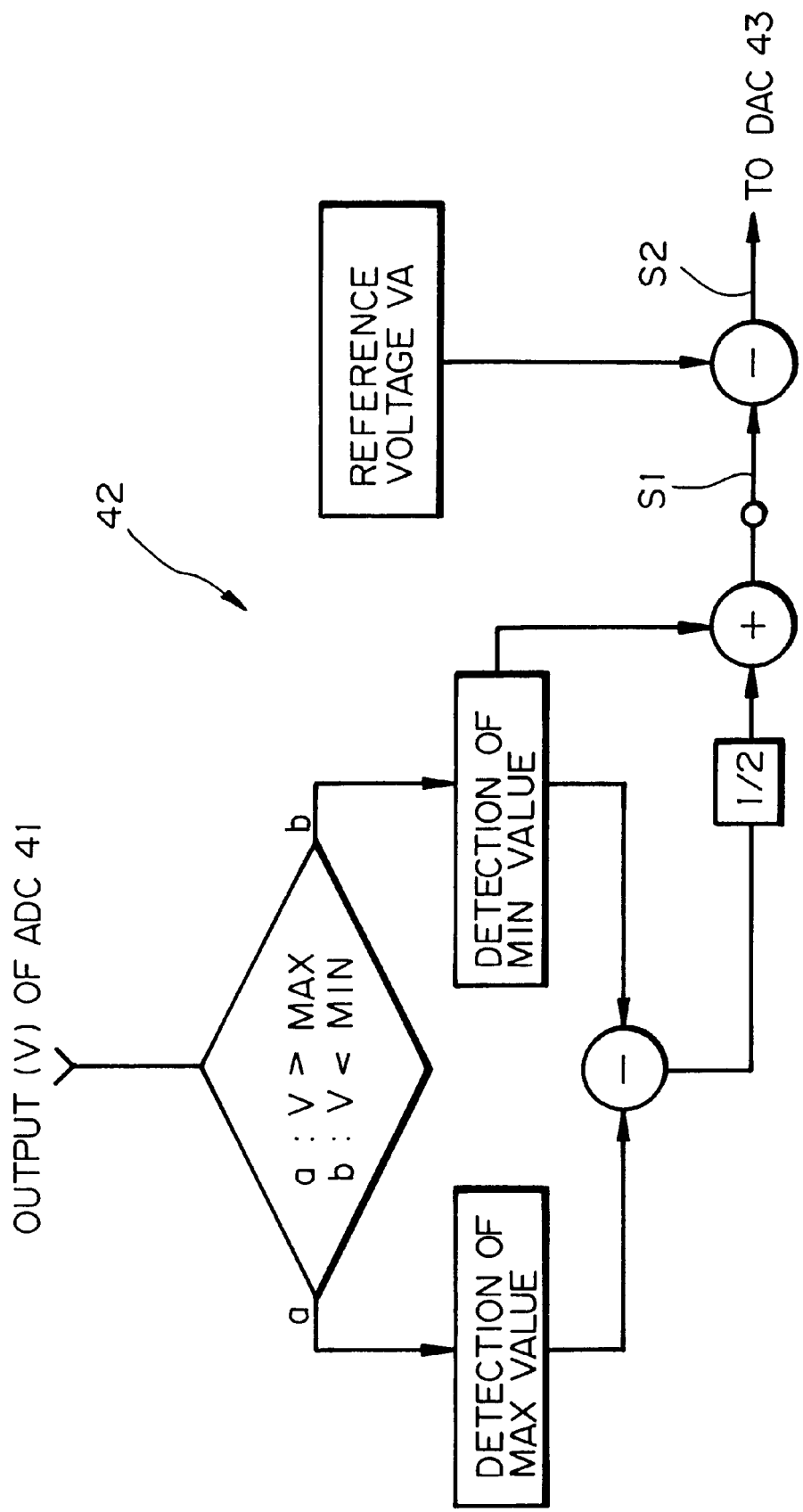

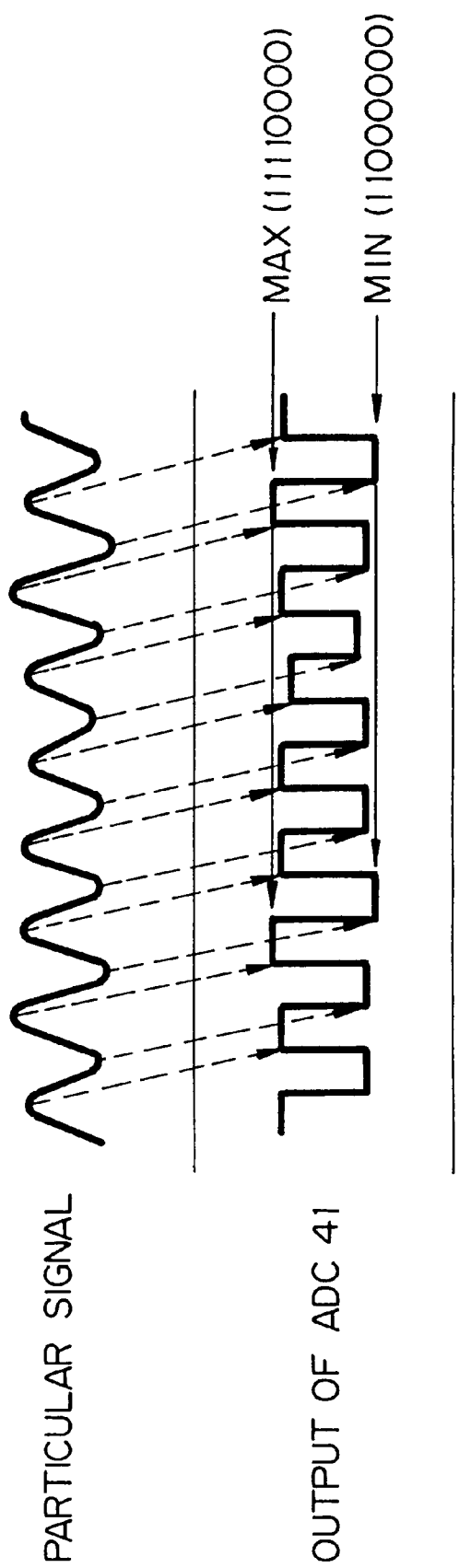

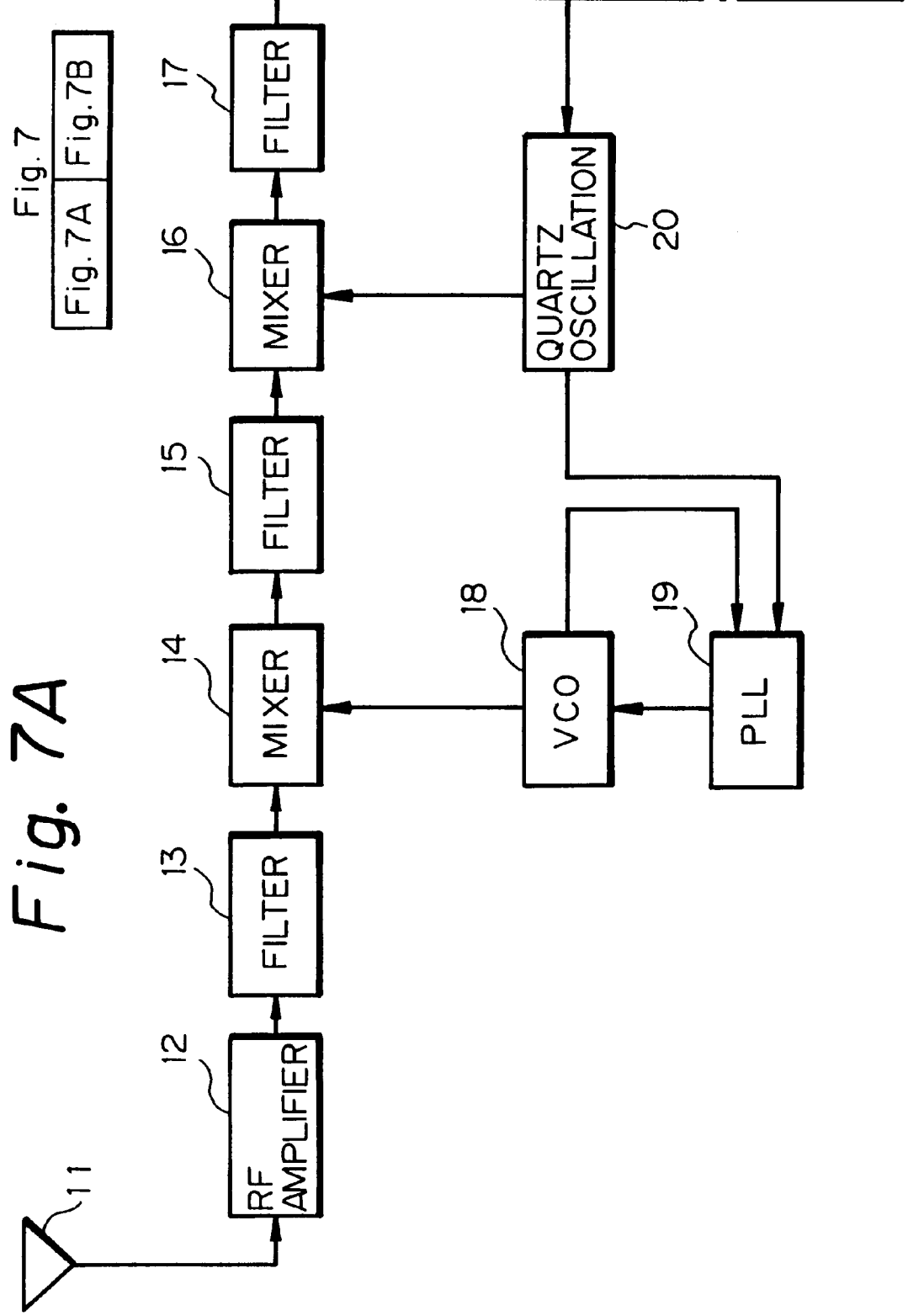

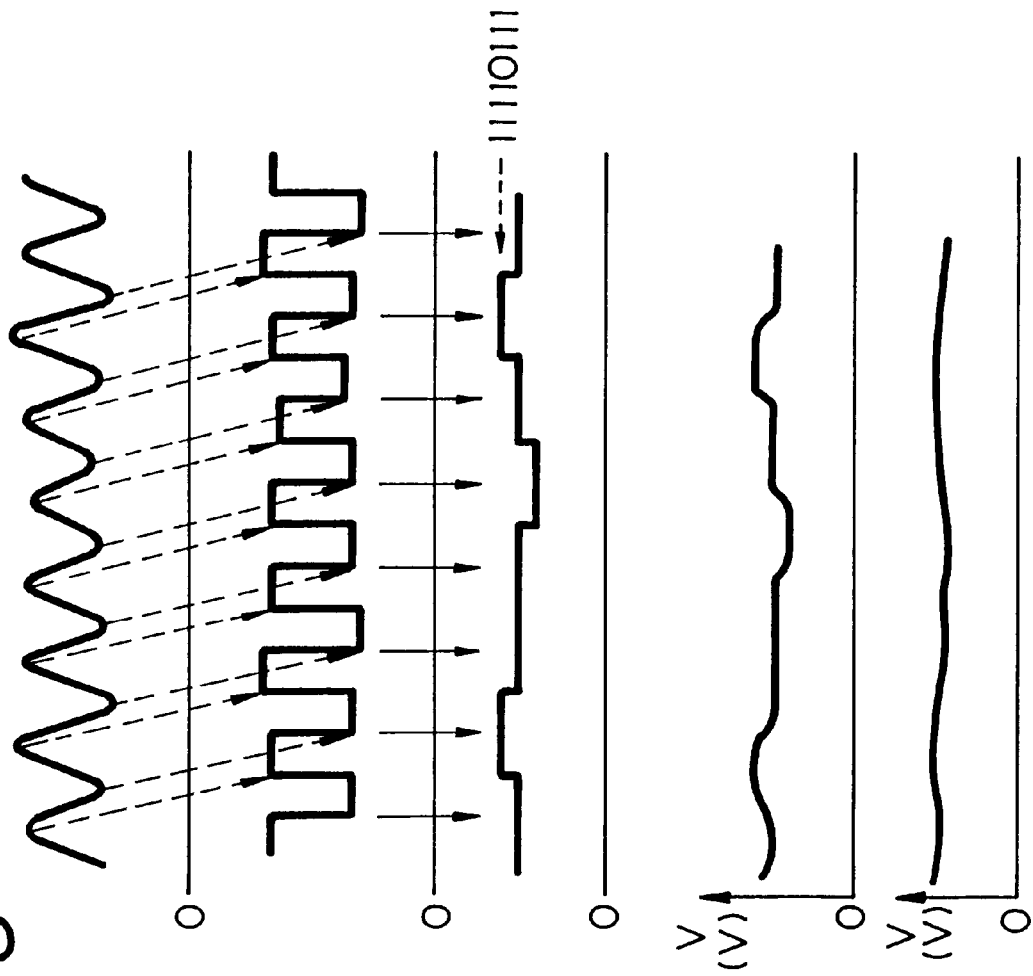

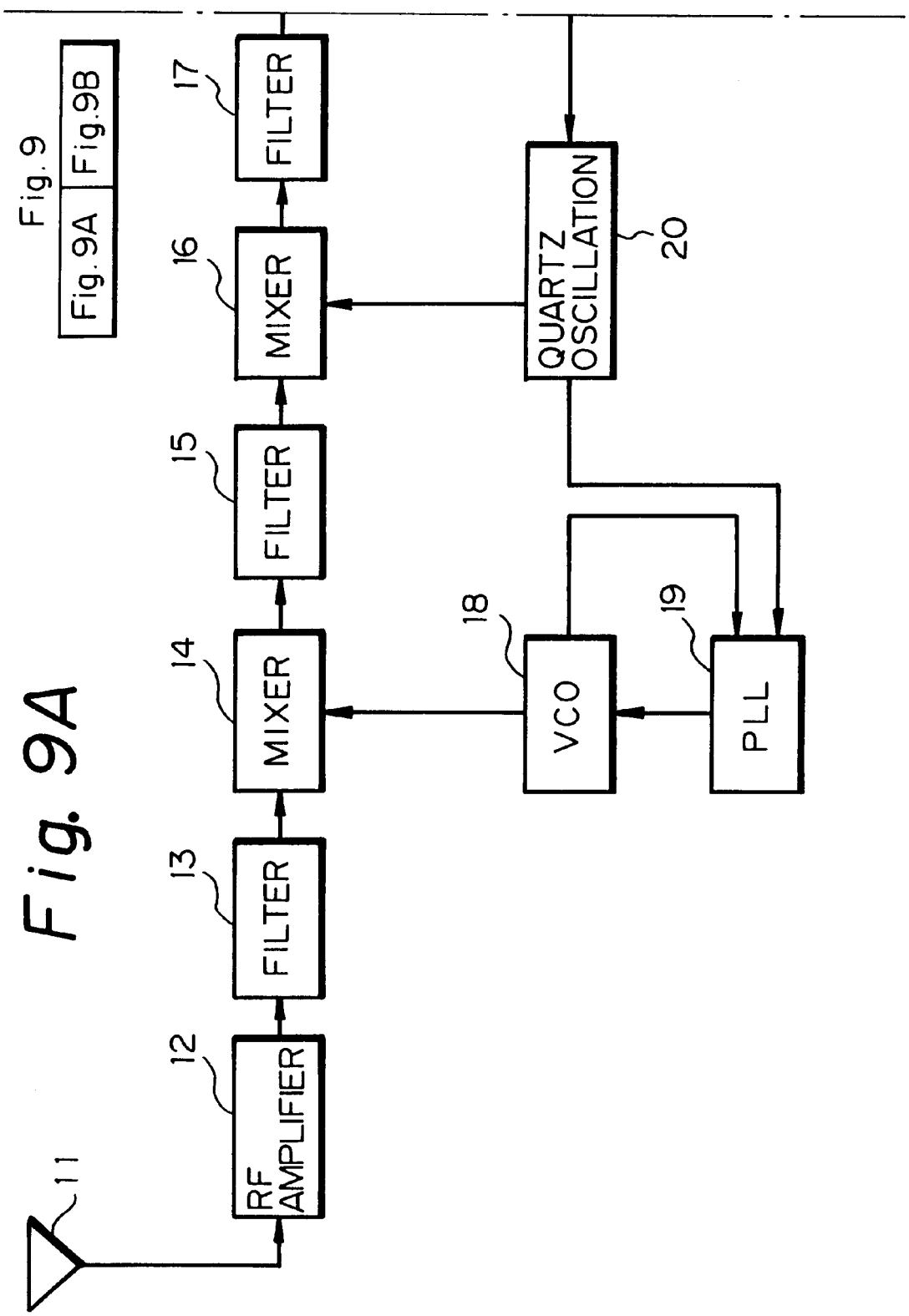

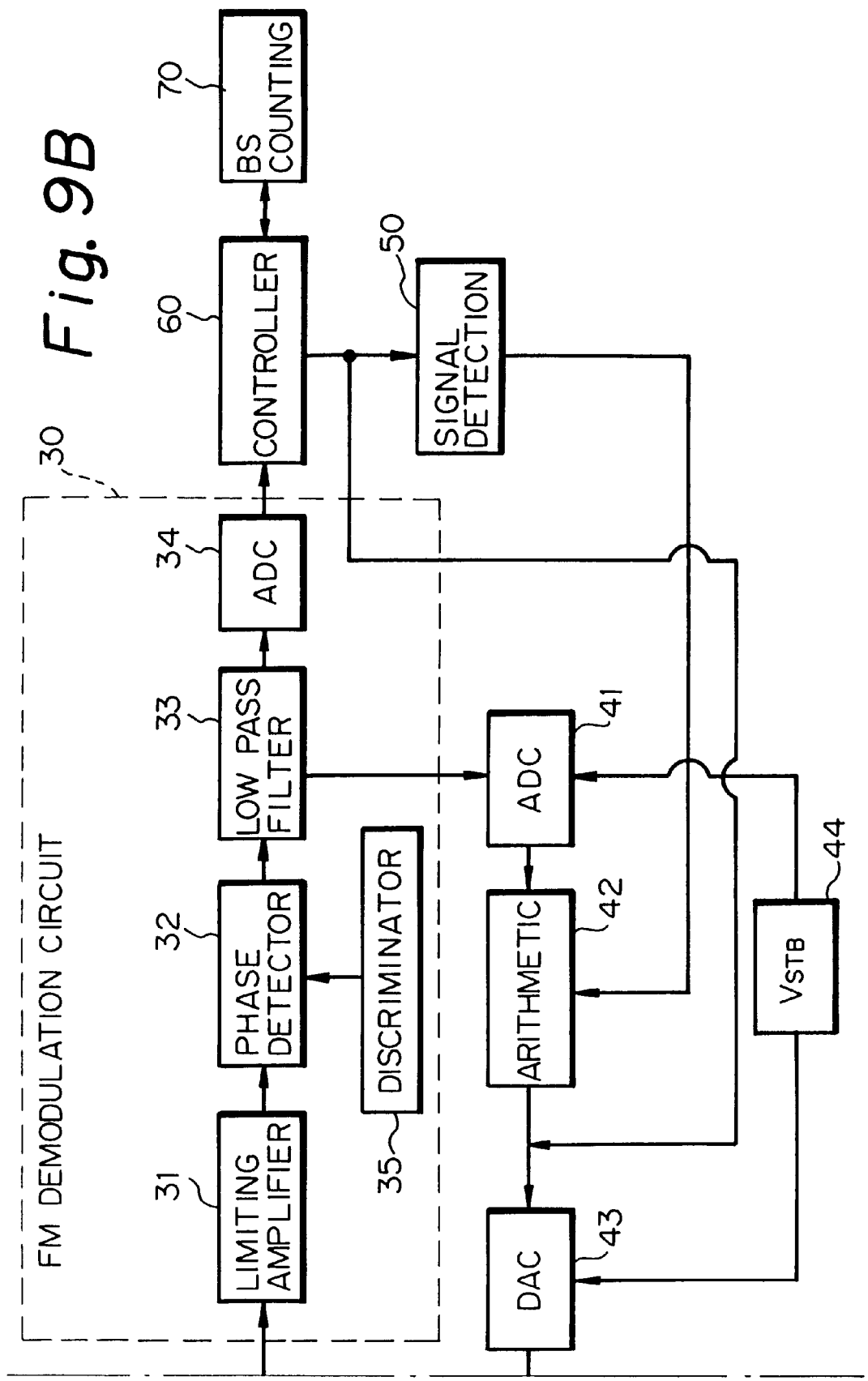

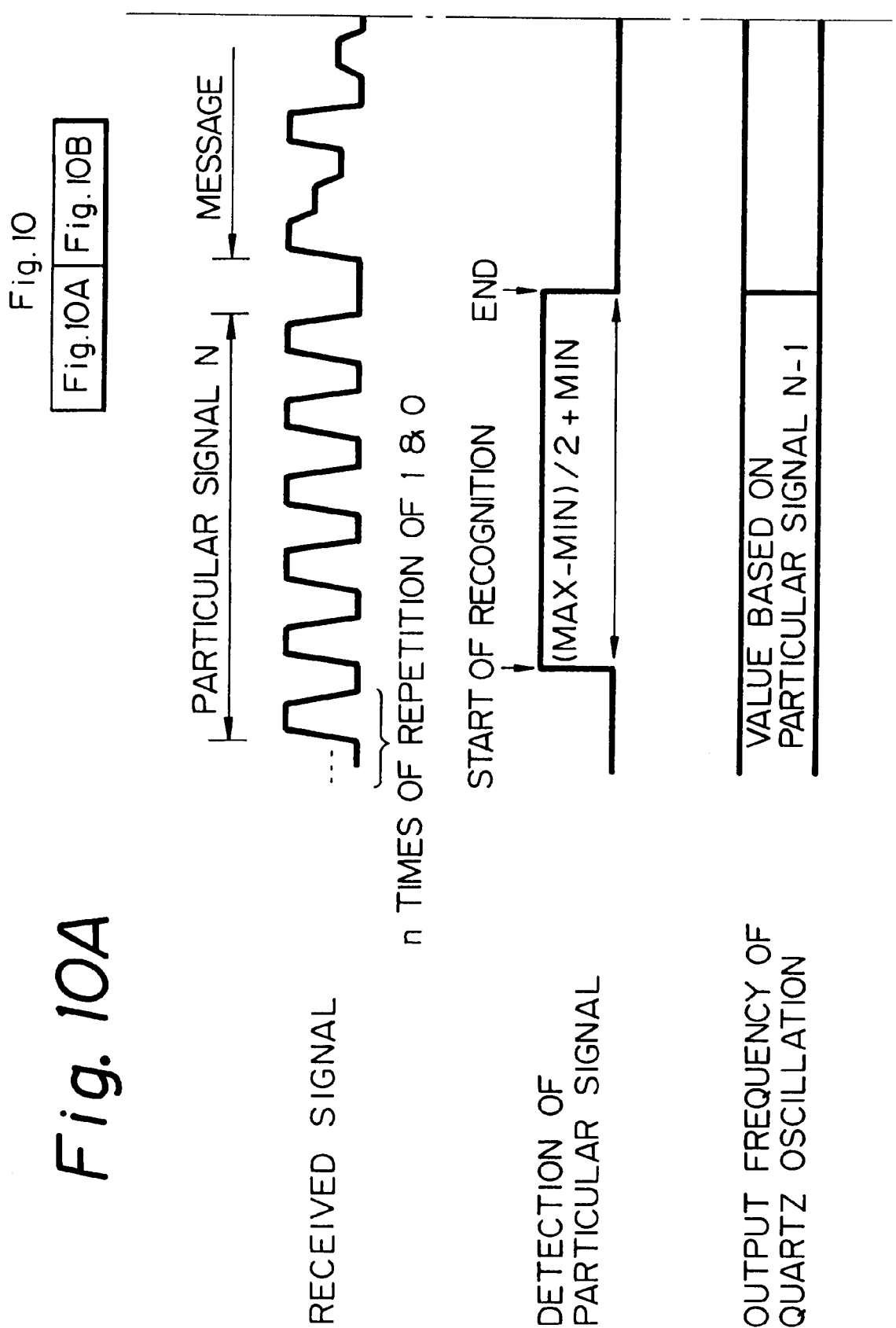

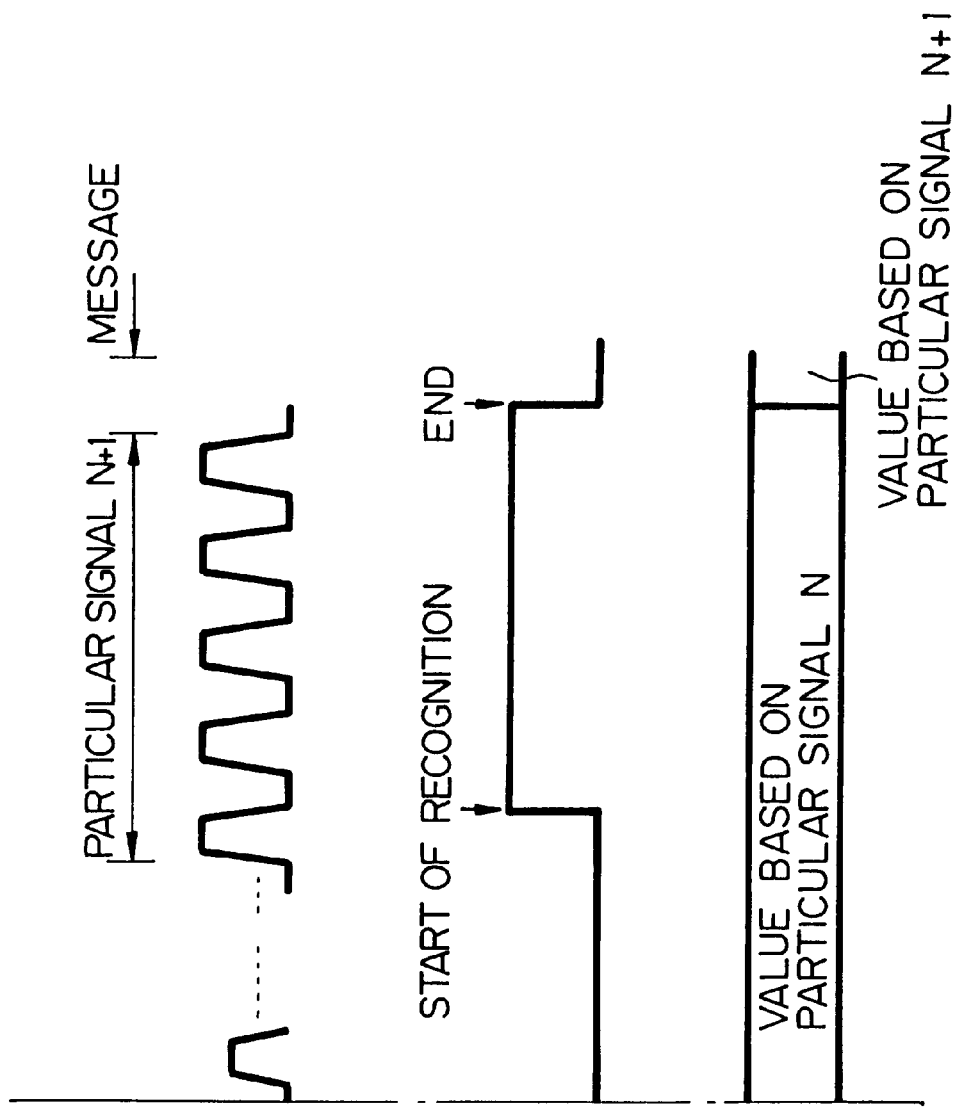

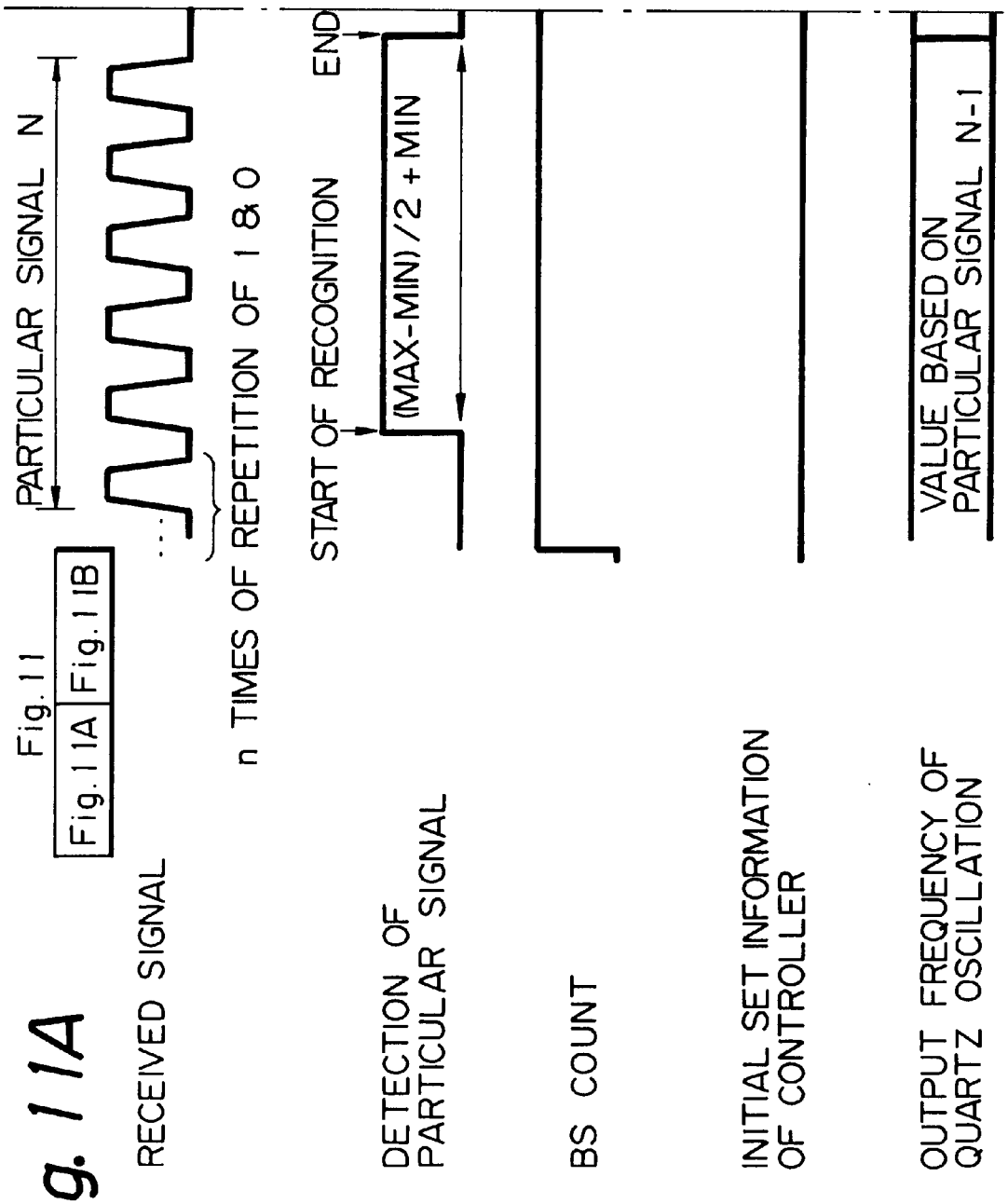

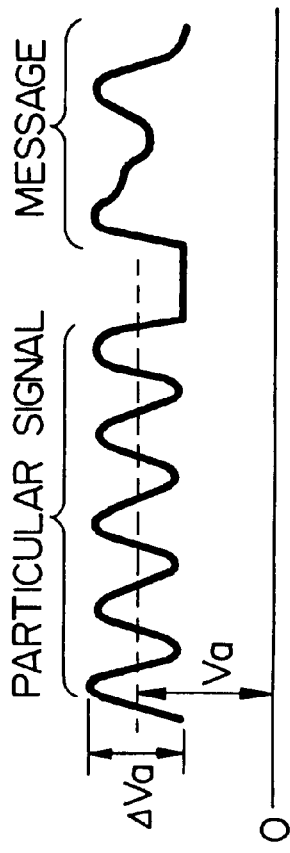
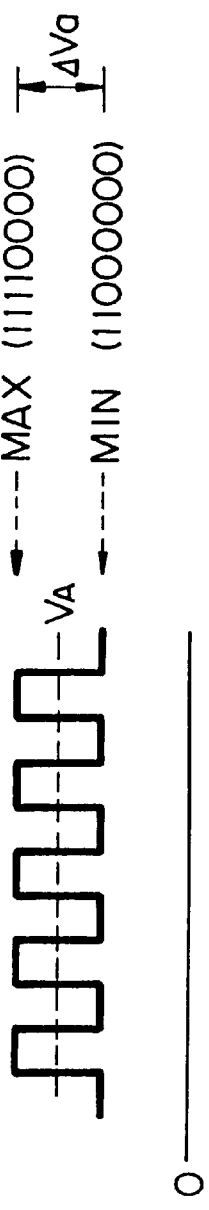
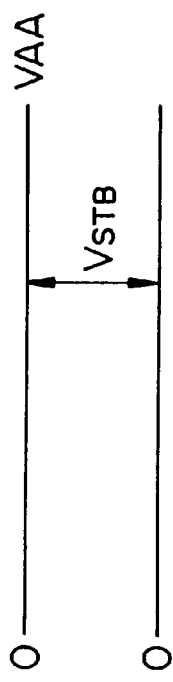
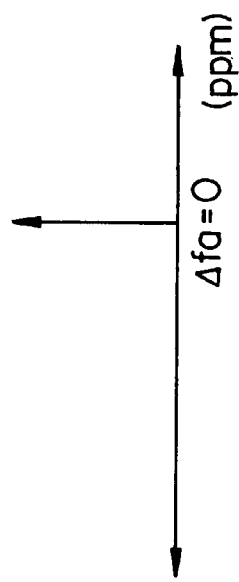
Fig. 14

RADIO PAGER

BACKGROUND OF THE INVENTION

The present invention relates to a radio pager having a frequency correcting function.

One of conventional schemes for demodulating an FM (Frequency Modulation) multilevel digital signal uses the characteristic of a discriminator connected in parallel with a damping resistor. This scheme transforms the FM signal to a voltage and then demodulates it on the basis of the characteristic of the discriminator. A multilevel signal representative of the above voltage is subjected to decision using preselected levels (voltages) at the subsequent stage. However, a problem with this discriminator scheme is that the phase characteristic of the discriminator is susceptible to changes in temperature and power source voltage. As a result, an IF (Intermediate Frequency)-to-DC voltage characteristic (f-V characteristic or S curve characteristic) derived from the phase characteristic of the discriminator is not constant. Another problem is that when a signal is offset at a transmitter side or when a reference oscillation section at a receiver side is influenced by, e.g., environment or inaccurate adjustment, the IF frequency varies at the output of a mixer and obstructs accurate multilevel decision to follow.

Japanese Patent Laid-Open Publication No. 58-14618 proposes a method of controlling a voltage controlled oscillator such that the mean frequency of the IF signal produced by frequency conversion coincides with the IF center frequency. For this purpose, a difference between the mean frequency of the IF signal and the IF center frequency is negatively fed back to the frequency control signal input terminal of the voltage controlled oscillator.

To correct the phase characteristic of the discriminator susceptible to temperature, the damping resistor connected in parallel with the discriminator may be replaced with a thermistor having a B constant, as also proposed in the past. The correction, however, cannot be done unless the B constant characteristic of the thermistor and the phase characteristic of the discriminator are matched.

When the frequency-to-phase (f-θ) characteristic varies due to the scatter of the discriminator ascribable to temperature or power source voltage, the f-V characteristic of a modulation circuit also varies. It has been customary with a receiver to mix the output of a local oscillator with a high frequency received signal in order to produce an IF signal. At this instant, the local oscillator is often adjusted by, e.g., a manually variable capacity implemented by a quartz oscillation circuit or a voltage controlled oscillator.

However, assume that the f-θ characteristic of the discriminator varies and causes the output voltage at the center frequency of the f-V characteristic converted by the discriminator to vary, that the transmission frequency varies due to offset transmission from a transmitter side, and/or that the local oscillator at a receiver side varies due to environment or inaccurate adjustment. Then, the IF frequency signal output from the mixer is shifted from the expected center frequency or the f-V characteristic of the discriminator itself varies. This prevents an accurate voltage amplitude and accurate multilevel decision from being guaranteed.

SUMMARY OF THE INVENTION

It is therefore an object of the present invention to provide a radio pager capable of automatically correcting a center frequency ascribable to the above variations, and thereby obviating erroneous decision on a multilevel digital signal.

A radio pager of the present invention includes a signal detecting section for detecting a particular signal, contained in an IF (Intermediate Frequency) signal output, from a low pass filter to thereby recognize the start and end of the signal. An arithmetic section stores the minimum value and maximum value of the particular signal occurred until the end of the particular signal, and compares a center amplitude, calculated from the maximum value and minimum value and a reference voltage to thereby output center voltage data. A quartz oscillation section controls, based on the center voltage data, an oscillation frequency to be input to a mixer, which outputs the IF signal, such that the center voltage of the output of the low pass filter coincides with an optimal value.

A smoothing circuit may be connected between the arithmetic section and the quartz oscillation section for smoothing a voltage derived from the center voltage data output from the arithmetic section.

BRIEF DESCRIPTION OF THE DRAWINGS

The above and other objects, features and advantages of the present invention will become apparent from the following detailed description taken with the accompanying drawings in which:

FIG. 3 is a block diagram schematically showing a radio pager embodying the present invention;

FIG. 4 is a schematic block diagram reprsentative of a procedure to be executed by an arithmetic section included in the illustrative embodiment;

FIG. 6 is a timing chart showing signals appearing in the illustrative embodiment;

FIG. 8 is a timing chart showing signals appearing in the embodiment of FIG. 7;

FIG. 9 is a block diagram schematically showing another alternative embodiment of the present invention;

FIG. 10 is a timing chart showing signals appearing in the embodiment of FIG. 3;

FIG. 14 is a timing chart showing signals derived from a characteristic curve A shown in FIG. 12;

DESCRIPTION OF THE PREFERRED EMBODIMENTS

Figure 1:
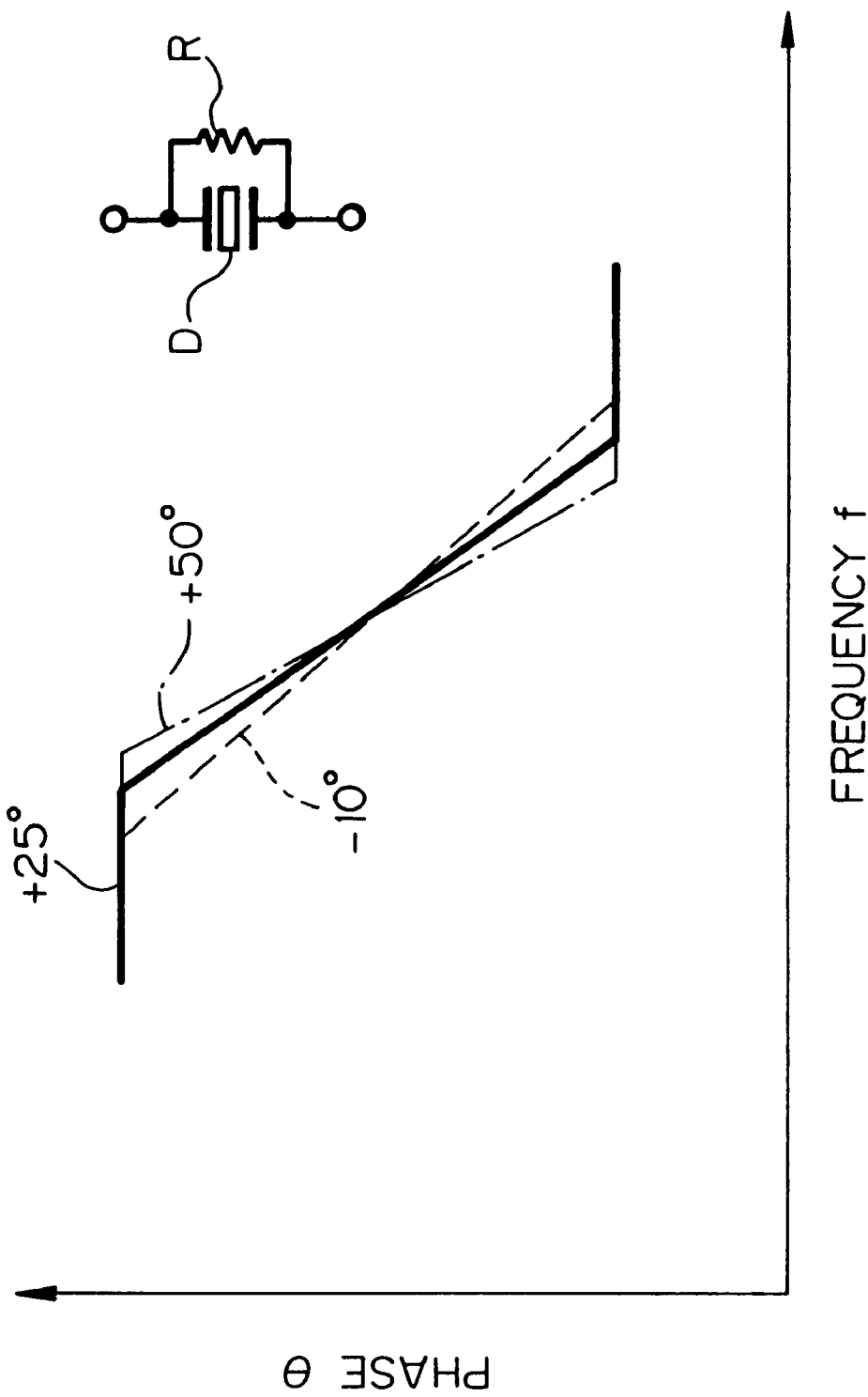
FIGS. 1 and 2 are graphs each showing a particular phase characteristic of a conventional discriminator.
Figure 2:
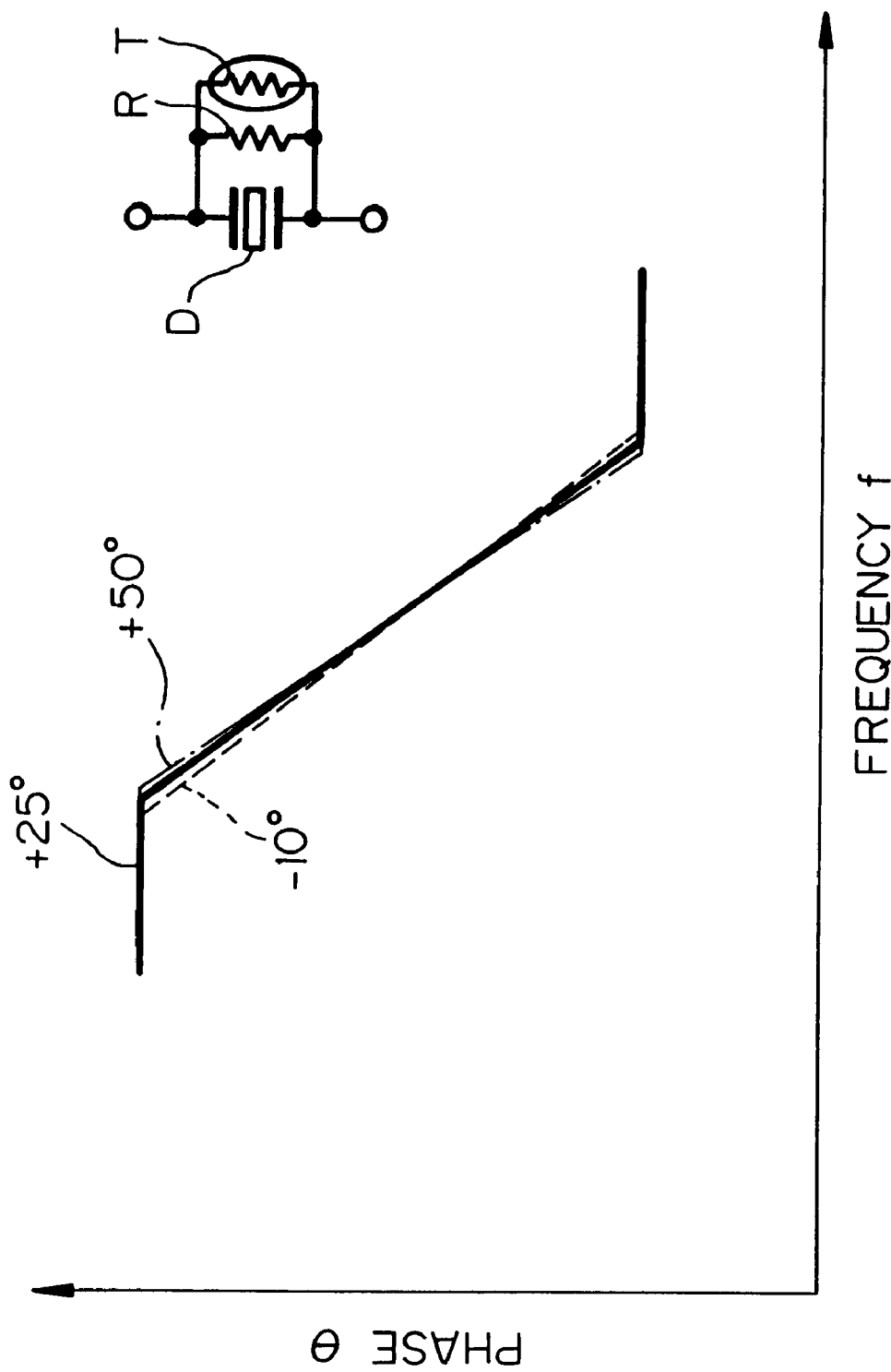

FIG. 1 shows the phase characteristic of a conventional discriminator, i.e., a discriminator D connected in parallel with a damping resistor R. FIG. 2 shows the phase characteristic of a discriminator D connected in parallel with a parallel connection of a damping resistor R and a thermistor T. When the frequency-to-phase (f-θ) characteristic varies due to the scatter of the discriminator D ascribable to temperature or power source voltage, the f-V characteristic of a demodulation circuit also varies, as stated earlier. The problem is that the IF frequency signal output from a mixer is shifted from the expected center frequency, or the f-V characteristic of the discriminator itself varies due to the variations discussed earlier. As a result, an accurate voltage amplitude and accurate multilevel decision form are not achievable.

Referring to FIG. 3, a radio pager embodying the present invention is shown. As shown, the radio pager includes an RF (Radio Frequency) amplifier 12. A high frequency signal coming in through an antenna 11 is amplified by the RF amplifier 12. A voltage controlled oscillator (VCO hereinafter) 18 oscillates while using a quartz oscillation 20 as a reference. A mixer 14 mixes the output of the VCO 18 and the output of the RF amplifier 12 passed through a filter 13, thereby effecting frequency conversion. A filter 15 filters out noise contained in the output of the mixer 14. A mixer 16 mixes the output of the quartz oscillation 20 and the output of the filter 15 and outputs an IF signal. The IF signal is routed through a filter 17 to an FM demodulation circuit 30. The FM demodulation circuit 30 is made up of a limiting amplifier 31, a phase detector 32, a low pass filter 33, an analog-to-digital converter (ADC), and a discriminator 35. The above IF signal is input to the phase detector 32 via the limiting amplifier 31. The phase detector 32 and low pass filter 33 converts, by using the f-θ characteristic of the discriminator 35, the frequency f of the IF signal to a DC voltage V to thereby implement a desired S curve characteristic.

After the low pass filter 33 has removed needless high frequency noise, the ADC 34 transforms data output from the filter 33 to digital data. A controller 60 performs decision on the digital data output from the ADC 34 as multilevel digital signal in accordance with given reference levels. An ADC 41 is connected in parallel with the ADC 34 and receives the same signal as the ADC 34. An arithmetic 42 includes a register and stores the maximum and minimum values of the data output from the ADC 41 in the register. The arithmetic 42 calculates a center value between the maximum and minimum values, determines a difference between the calculated center value and a preselected reference center value, and feeds data representative of the difference to a digital-to-analog converter (DAC) 43.

The DAC 43 transforms the digital data received from the arithmetic 42 to analog data and delivers the analog data to a variable capacity diode, not shown, included in the quartz oscillator 20. A signal detection 50 feeds, on detecting a particular signal, a signal representative of the start of recognition of the signal to the arithmetic 42 and feeds, when the above signal ends, a signal representative of the end of the signal to the arithmetic 42. Generally, a signal received from a base station contains an address number assigned to the pager and message information. The address number and message information, which are asynchronous, are usually preceded by a particular signal (preamble signal) in the form of ONEs and ZEROs appearing alternately in order to synchronize them. In the illustrative embodiment, the signal detection 50 detects the sequence of alternating ONEs and ZEROs as a particular signal mentioned above.

FIG. 4 demonstrates a procedure to be executed by the arithmetic 42 specifically. As shown, the arithmetic 42 samples the digital data output from the ADC 41 and stores the maximum and minimum values of the sampled data, i.e., amplitudes V in its register. The arithmetic 42 produces a difference between the maximum and minimum values stored in the register, divides the difference by 2, adds the minimum data to the resulting quotient, compares the resulting sum (S1) with a reference voltage VA representative of a preselected center value, and feeds the resulting difference (reference voltage VA−sum S1) to the DAC 43. The DAC 43 converts the data output from the arithmetic 42 to analog data and delivers the analog data to the quartz oscillation 20.

Figure 5:
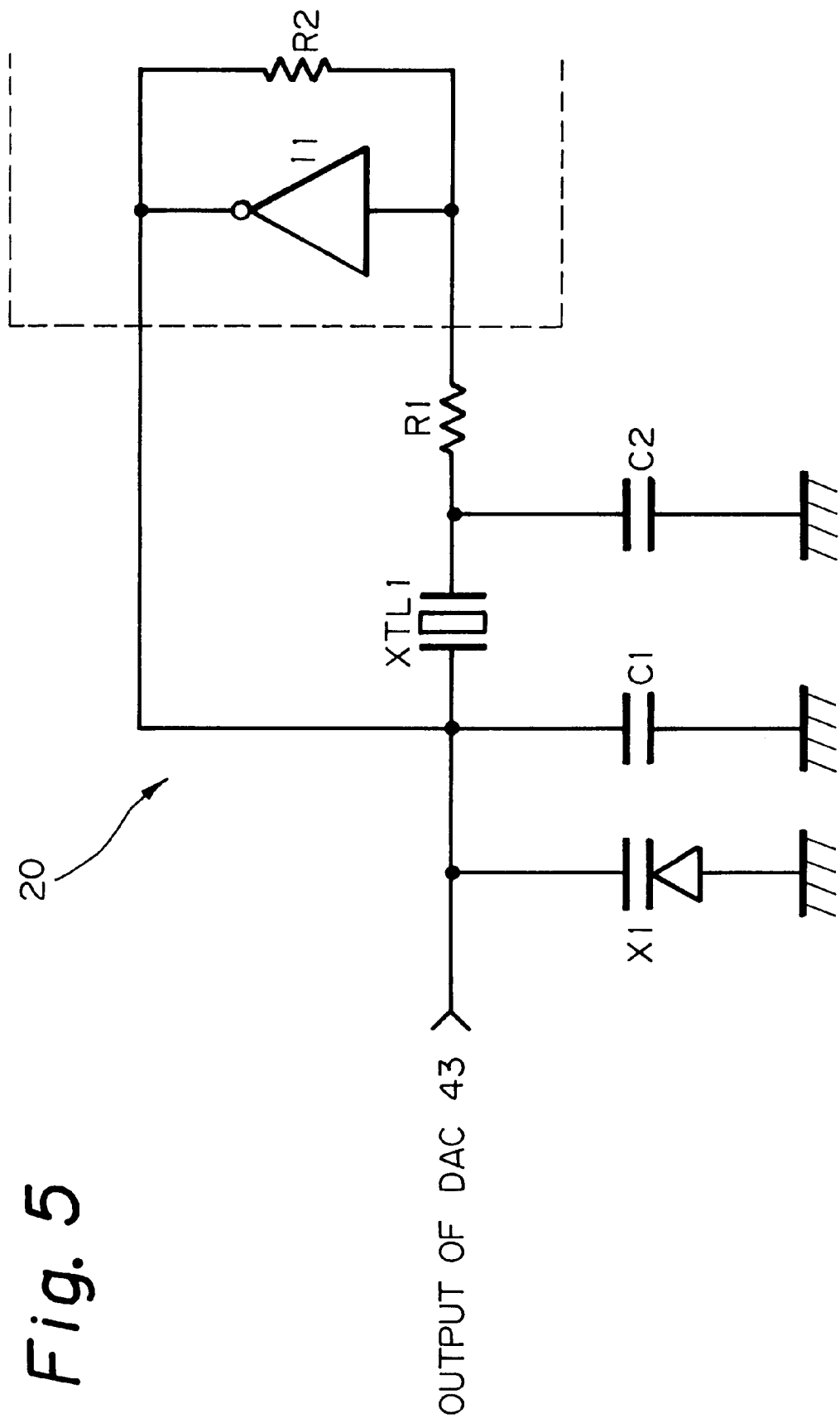
FIG. 5 is a circuit diagram showing a specific configuration of a quartz oscillation section also included in the illustrative embodiment.
Figure 12:
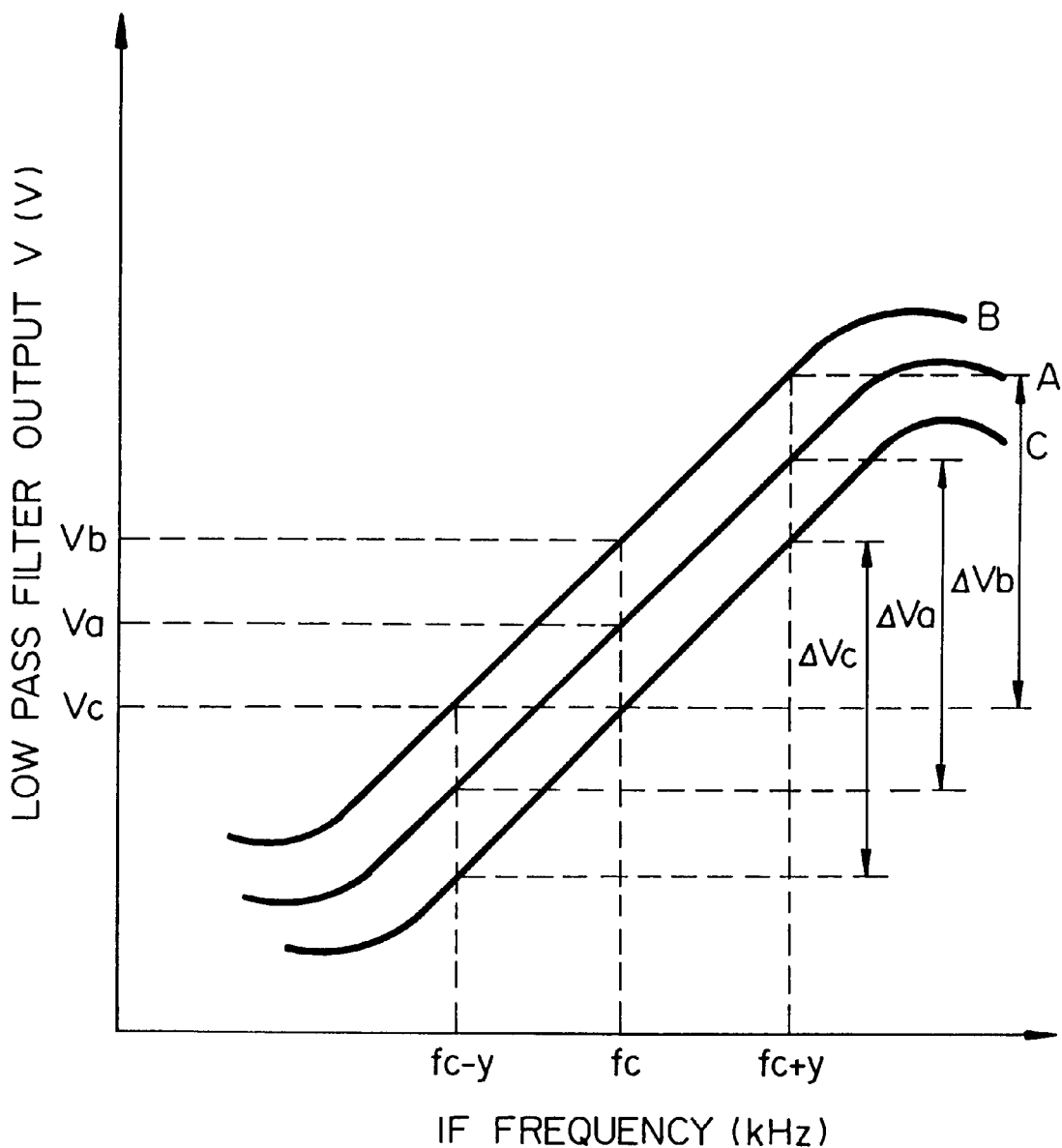
FIG. 12 is a graph showing an f-V characteristic available with an FM demodulation circuit in accordance with the present invention.
Figure 13:
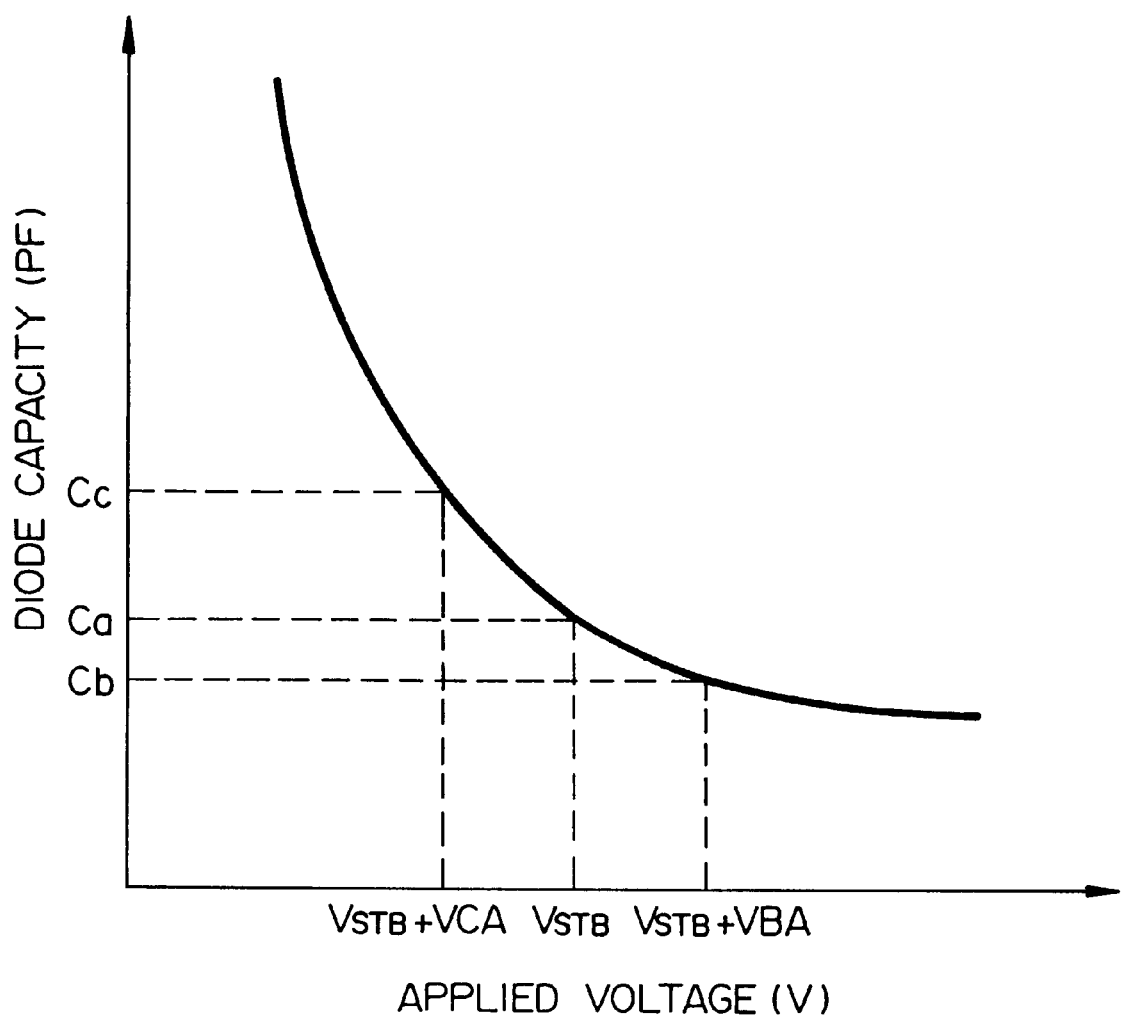
FIG. 13 is a graph showing a voltage-to-capacity characteristic available with a variable capacity diode in accordance with the present invention.

FIG. 5 shows a specific configuration of the quartz oscillation 20. As shown, the oscillation 20 finely adjusts the oscillation frequency by use of a quartz oscillator XTL1 on the basis of the capacities of capacitors C1 and C2. A variable capacity diode X1 is connected in parallel with the capacitor C1, so that the composite capacity of the two capacitors C1 and X1 varies with the variation of the capacity of the diode X1. As shown in FIG. 13, the capacity of the diode X1 varies in accordance with a voltage applied thereto. It follows that the oscillation frequency of the quartz oscillation 20 varies in accordance with the voltage calculated by the arithmetic 42. FIG. 12 shows f-V characteristic curves A, B and C. Assume that the curve A is representative of an optimal f-V characteristic. Then, a voltage coincident with the voltage Va of the particular signal is optimal. Data representative of such a voltage is transformed to an analog voltage by the DAC 43 and then applied to the quartz oscillation 20 for controlling the oscillation.

The operation of the illustrative embodiment will be described hereinafter. FIG. 6 shows a relation between the particular signal and the output of the ADC 41. When the signal detection 50 detects a signal identical with the particular signal of FIG. 6, it feeds a signal representative of the start of recognition to the arithmetic 42, as stated earlier. In the arithmetic 42, the ADC 41 converts the analog particular signal to a digital signal. When the particular signal ends, the detection 50 delivers a signal reprsentative of the end of the signal to the arithmetic 42, as also stated earlier. Among the data appeared until the end of the particular signal, data representative of the maximum value and data representative of the minimum value are written to the register of the arithmetic 42.

Let the ADC 41 be assumed to output eight-bit data by way of example. Assume that the maximum value data of "11110000" and minimum value data of "1100000" are written to the register of the arithmetic 42. In response to the signal representative of the end of the particular signal, the arithmetic 42 divides the difference between the above maximum and minimum values by 2 and adds the minimum value to the resulting quotient to thereby produce a center value (output S1). Then, the arithmetic 42 subtracts the output S1 from the reference voltage data VA (VA= 11011000). As a result, voltage data VAA of "00000000" is fed from the operation 42 to the DAC 43.

The above procedure may be expressed as:

$$(11110000-11000000)\times(\tfrac{1}{2})+11000000)=11011000 \quad \text{(output S1; VA)}$$

$$11011000-11011000=00000000 \quad \text{(output S2; VAA)}$$

The DAC 43 converts the voltage data output from the arithmetic 42 to analog voltage data and feeds the analog voltage data to the variable capacity diode X1 of the quartz oscillation 20. To increase or decrease the capacity of the diode X1, a certain voltage is essential, as stated previously.

It is therefore necessary to apply an offset corresponding to an offset setting voltage VSTB (V) to the DAC 43. The same offset is also applied to the ADC 41. In this condition, the capacitors C1 and C2 implement the oscillation frequency of the quartz oscillation 20 which allows, in the optimal condition, the center voltage of the output of the filter 33 to coincide with the previously mentioned voltage Va.

Figure 7B:
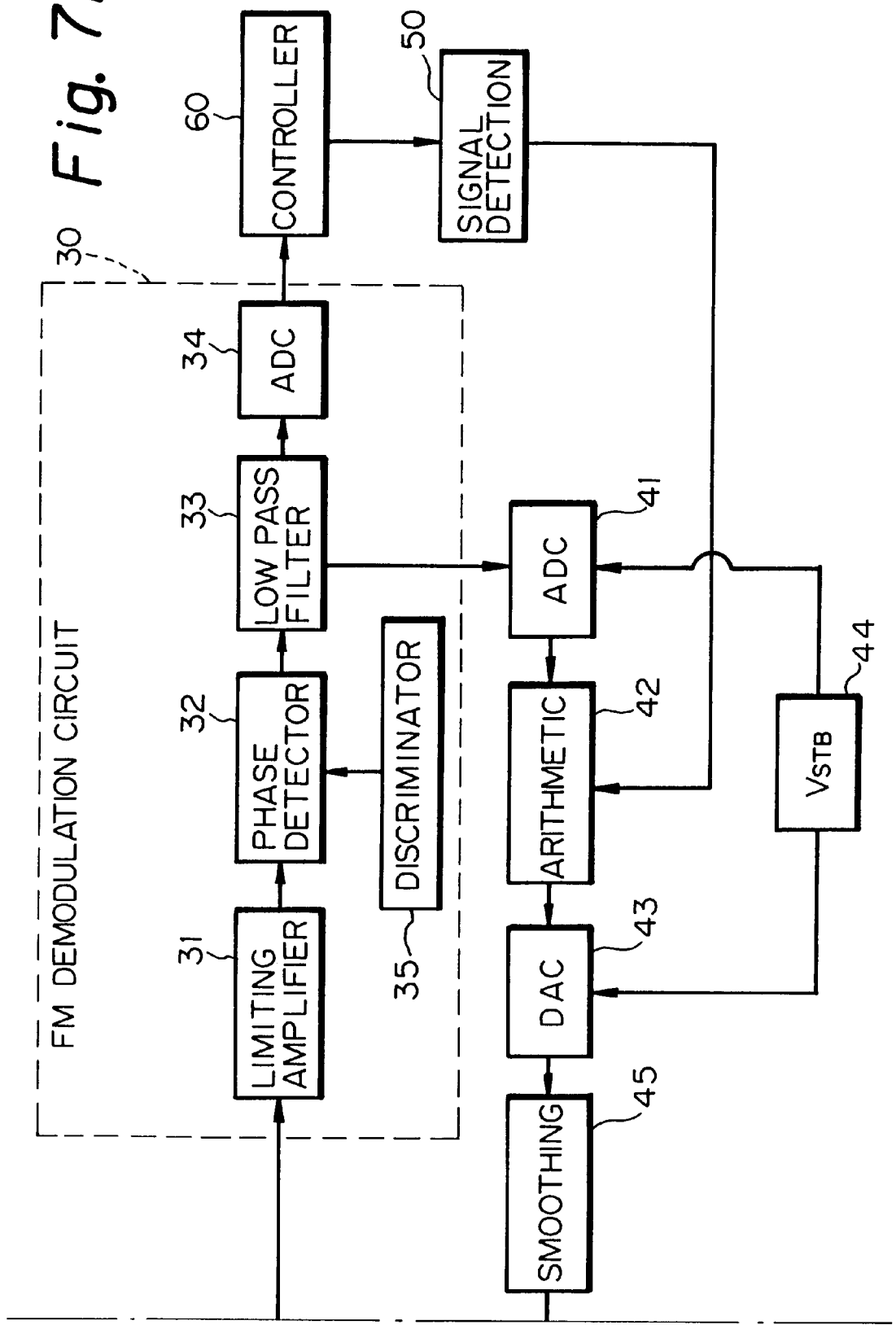
FIG. 7 is a block diagram schematically showing an alternative embodiment of the present invention.

An alternative embodiment of the present invention will be described with reference to FIG. 7. As shown, this embodiment is identical with the previous embodiment except that a smoothing section 45 is connected between the DAC 43 and the quartz oscillation 20. The analog data output from the DAC 43 is input to the quartz oscillation 20 via the smoothing section 45. FIG. 8 shows the particular signal output from the low pass filter 33, data output from the ADC 41, data output from the arithmetic 42, voltage output form the DAC 43, and voltage output from the smoothing section 45 (input to the variable capacity diode X1). In this configuration, voltages following irregularities in the voltage amplitude of the particular signal are applied to the quartz oscillator 20, causing the oscillation frequency to vary accordingly. This allows the center voltage of the output of the low pass filter 33 to coincide with the optimal voltage Va and thereby reduces erroneous multilevel decision ascribable to FM noise.

Referring to FIG. 9, another alternative embodiment of the present invention is shown and includes a BS (Battery Saving) counting 70. A radio pager with a BS function is conventional and constructed to turn off power supply to its radio section at a preselected timing in order to extend the life of a battery. Usually, the BA function is brought to its OFF state (power supply ON) every second or so and held in the OFF state for about 50 millisecond. As shown in FIG. 9, the BS counting 70 is connected to the controller 60 and counts the BS OFF states occurred after the last particular signal (including message information). When the count of BS OFF states reaches a preselected count X without any particular signal being detected, the controller 60 delivers an initial center voltage data stored therein beforehand to the DAC 43. As a result, the oscillation frequency of the quartz oscillation 20 is controlled by a voltage output from the DAC 43.

Figure 11B:
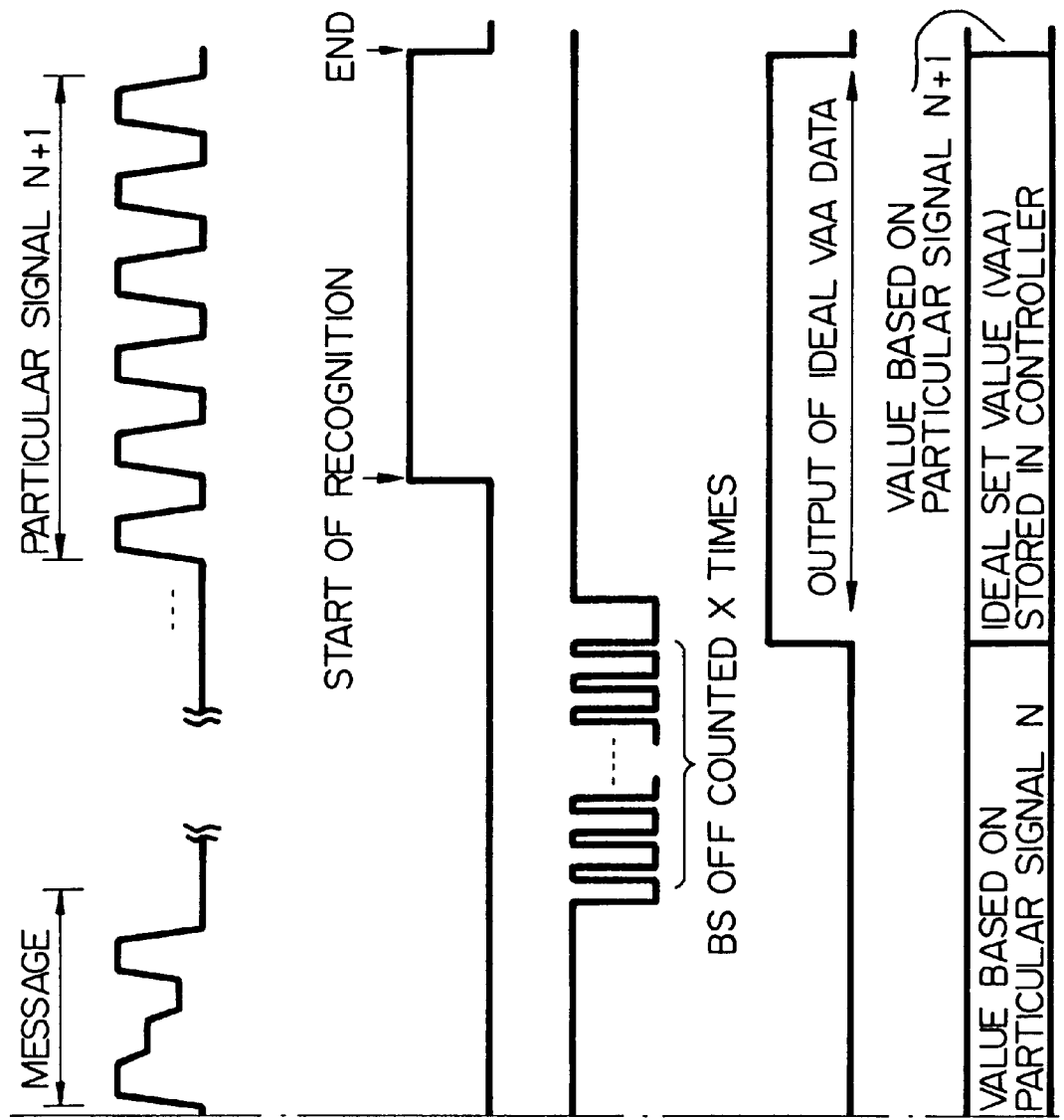
FIG. 11 is a timing chart showing signals appearing in the embodiment of FIG. 9.

FIG. 10 shows a relation between the received signal, the detection of the particular signal, and the oscillation frequency of the quartz oscillation 20 particular to the pager of FIG. 3. FIG. 11 shows a relation between the received signal, the detection of the particular signal, the BS counting operation, and the oscillation frequency of the quartz oscillation 20 particular to the pager of FIG. 9.

As shown in FIG. 10, assume that the particular signal or preamble signal, labeled N, output from the ADC 34 is input to the controller 60 of the pager shown in FIG. 3. Then, when a ONE and a ZERO appear n consecutive times alternately, the signal detection 50 identifies the particular signal N and feeds the signal representative of the start of recognition to the arithmetic 42. When the particular signal N ends, the signal detection 50 feeds the signal representative of the of the signal N to the arithmetic 42. The arithmetic 42 executes the previously stated procedure in response to the above start signal and end signal. As a result, as for a message received after the above particular signal N, the voltage calculated on the basis of the signal N and applied to the variable capacity diode X1 is maintained.

As shown in FIG. 11, when the signal detection 50 included in the pager of FIG. 9 detects the particular signal N, a message following the signal N is received with a voltage based on the signal N being applied to the quartz oscillation 20 in the same manner as in FIG. 10. However, the difference is that when the count of the BS OFF states reaches a preselected count without a new particular signal N being detected after the end of the above message, the controller 60 feeds preselected amplitude data VAA of "00000000" (optimal data) to the DAC 43 so as to control the voltage to be applied to the variable capacity diode X1.

The curves A, B and C shown in FIG. 12 each is representative of a particular demodulation output (f-V characteristic or S curve characteristic) generally implemented by the discriminator or demodulator 35. The f-θ characteristic of the discriminator 35 varies due to the scatter of the discriminator 35 itself and environmental conditions. This is why the f-V characteristic varies as represented by the curves A–C. The operation of the ADC 30 will be described hereinafter, assuming the optimal curve A first.

FIG. 14 shows a relation between the input to the ADC 41 (output of the low-pass filter 33), the output of the ADC 41, the data output from the arithmetic 42, the output of the DAC 43, and the deviation of the oscillation frequency of the quartz oscillation 20. As shown, because the particular signal or preamble signal fluctuates within the modulation frequency, the waveform input to the ADC 41 has a center voltage of Va (V) and an amplitude of ΔVa (V). The ADC 41 digitizes the input waveform to thereby output, e.g., the maximum value of "11110000" and the minimum value of "11000000". The arithmetic 42 adds the minimum value to the difference between the maximum and minimum values divided by 2 and outputs a center voltage VA of "11011000", as stated earlier. Further, the arithmetic 42 subtracts the center voltage VA from the reference voltage VA and feeds the difference, i.e., center voltage data VAA of "0000000" to the DAC 43.

Figure 15:
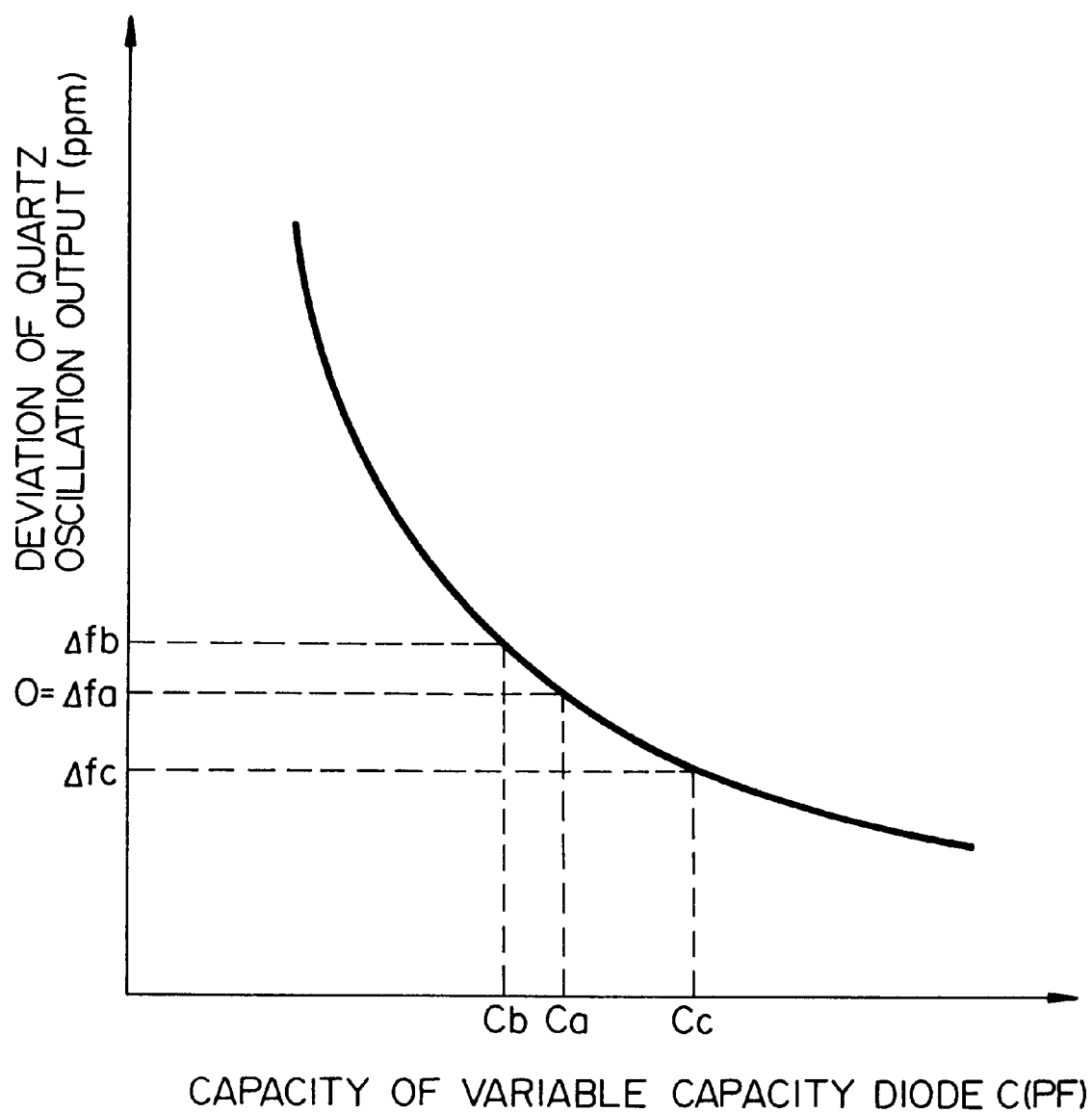
FIG. 15 is a graph showing a capacity-to-oscillation frequency characteristic available with the variable capacity diode in accordance with the present ivention.

The DAC 43 therefore transforms the input data VAA to a DC voltage offset by an offset setting (VSTB) 44 in accordance with the offset setting voltage VSTB (V). The DC voltage is applied to the variable capacity diode X1 of the quartz oscillation 20. The capacity of the diode X1 varies in accordance with a voltage input thereto, as stated previously with reference to FIG. 3. Further, if a relation shown in FIG. 15 is set between the oscillation frequency of the quartz oscillation 20 and the capacity of the diode X1, then a voltage Va is input to the diode X1 in the optimal condition and reduces the deviation Δfa of the oscillation frequency of the oscillation 20 to zero.

Figure 16:
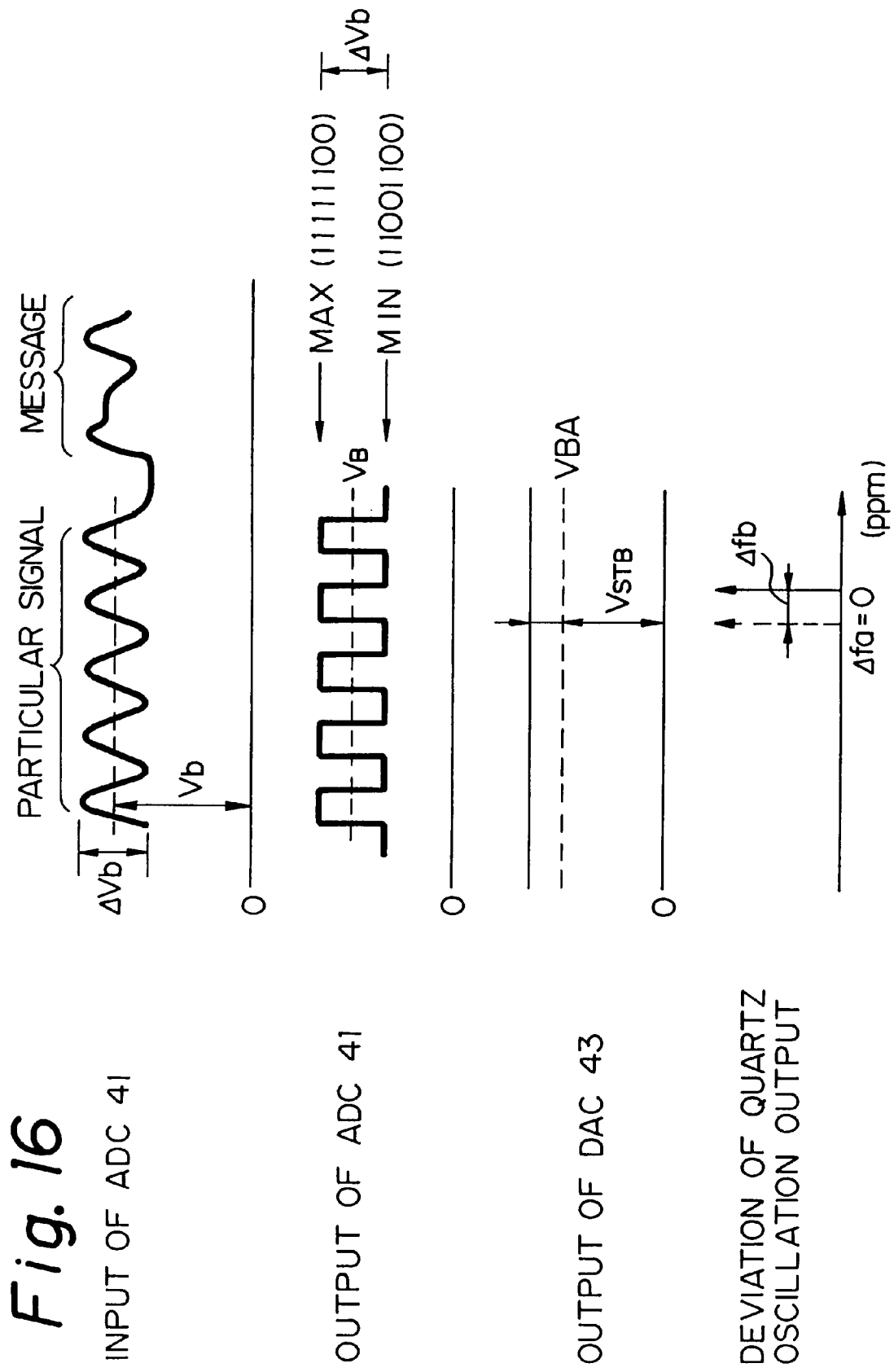
FIGS. 16 and 17 are timing charts respectively showing signals derived from a characteristic curve B and a characteristic curve C shown in FIG. 12.

The demodulation circuit 30 with an f-V conversion characteristic represented by the curve B operates, as follows. In this case, as shown in FIG. 16, the waveform input to the ADC 41 has a center voltage of Vb(V) higher than Va and an amplitude of ΔVb (V). When such a waveform is digitized by the ADC 41, the maximum value and minimum value are, e.g., "11111100" and "11001100", respectively. As a result, the arithmetic 42 outputs data representative of a center voltage VB of "11100100" by the calculation stated previously. A difference VBA of "00001100" between the calculated center voltage VB and the reference voltage VA is fed from the arithmetic 42 to the DAC 43.

The DAC 43 transforms the input data VBA to a DC voltage of (VBA+VSTB) offset by the offset setting voltage VSTB (V) and delivers the DC voltage to the variable capacity diode X1 of the quarts oscillation 20. Consequently, the oscillation frequency of the oscillation 20 is deviated by Δfb to the positive side from Δfa available with the curve A, as will be seen from FIGS. 13 and 15. The resulting f-V characteristic deviated to the negative side can be corrected if the oscillation frequency of the oscillation 20 is shifted to the negative side, so that accurate demodulation is achievable. As a result, the IF frequency output from the filter 17 is shifted to the negative side.

Figure 17:
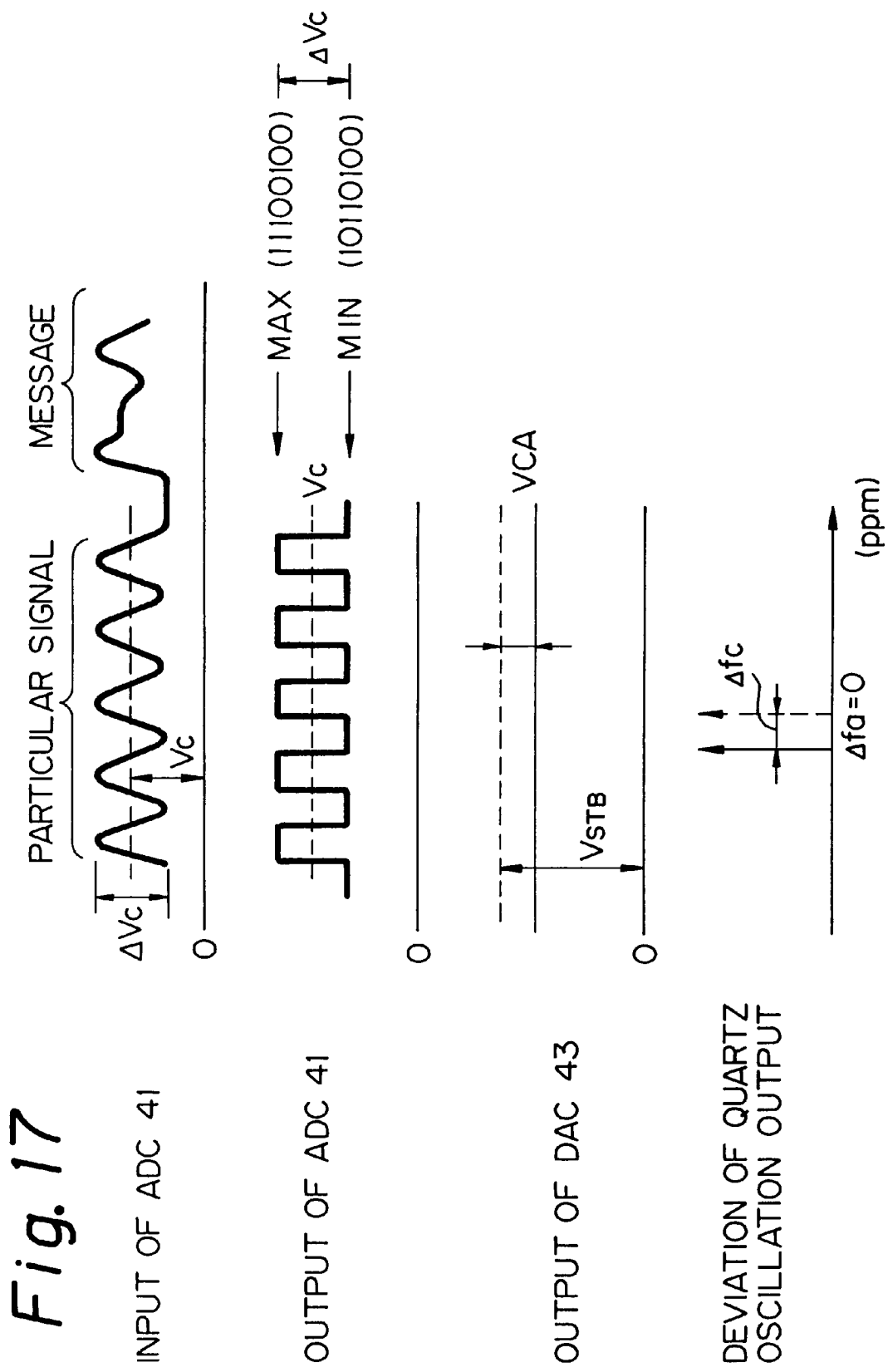

On the other hand, the demodulation circuit 30 with an f-V conversion characteristic represented by the curve C operates, as follows. In this case, as shown in FIG. 17, the waveform input to the ADC 41 has a center voltage of Vc(V) lower than Va and an amplitude of ΔVc (V). When such a waveform is digitized by the ADC 41, the maximum value and minimum value are, e.g., "11100100" and "10110100", respectively. As a result, the arithmetic 42 outputs data representative of a center voltage VC of "11001100" by the calculation stated previously. A difference VCA of "−00001100" between the calculated center voltage VB and the reference voltage VA is fed from the arithmetic 42 to the DAC 43.

The DAC 43 transforms the input data VCA to a DC voltage of (VCA+VSTB) offset by the offset setting voltage VSTB (V). The arithmetic 42 produces a difference between the calculated center voltage VC and the reference voltage VA and feeds it to the DAC 43. The DAC 43 transforms the input data to a DC voltage (Va−Vc) and applies it to the variable capacity diode X1. Consequently, the oscillation frequency of the quartz oscillation 20 is deviated by Δfc to the negative side from Δfa available with the curve A, as will be seen from FIGS. 13 and 15. The resulting f-V characteristic deviated to the positive side can be corrected if the oscillation frequency of the oscillation 20 is shifted to the positive side, so that accurate demodulation is achievable. As a result, the IF frequency output from the filter 17 is shifted to the positive side.

As described above, the curve A of FIG. 12 allowing the low pass filter 33 to output the voltage Va (V) for the IF frequency fc causes the ADC 41 to output the optimal voltage VA. As for the curve B, the output voltage increases to Vb above Va for the IF frequency fc and makes demodulation in the demodulation circuit 30 difficult at the positive side (fc+y). As for the curve C, the output voltage decreases to Vc below Va for the IF frequency fc and makes demodulation in the demodulation circuit 30 difficult at the negative side (fc−y). In accordance with the present invention, even when the f-V characteristic varies to one represented by the curve B or C, the deviation of the center frequency of the f-V characteristic of the demodulating section is corrected. This insures accurate decision on a multilevel digital signal.

In summary, in accordance with the present invention, an arithmetic section determines, during an interval between the start and the end of a particular signal, a center amplitude based on the maximum and minimum values of the signal, produces a difference between the center amplitude and a reference voltage, and feeds back the resulting center voltage data to a quartz oscillation section or reference oscillation section. As a result, the oscillation frequency of the oscillation section is automatically corrected. Therefore, there can be corrected the deviation of the center frequency of the f-V characteristic ascribable to a change in the f-V characteristic of an FM demodulation circuit caused by the scatter of a discriminator included in the demodulation circuit itself and the varying environmental conditions including temperature, a change in the transmission frequency of a transmitter side caused by offset transmission, and a change in the IF frequency of a receiver side caused by a change in the characteristic of a reference oscillator ascribable to environment, inaccurate adjustment and so forth. Consequently, an accurate voltage amplitude and therefore accurate multilevel decision is insured.

Various modifications will become possible for those skilled in the art after receiving the teachings of the present disclosure without departing from the scope thereof.

What is claimed is:

1. A radio pager comprising:
   a signal detecting section for detecting a particular signal contained in an IF (Intermediate Frequency) signal output from a low pass filter to thereby recognize a start and an end of said particular signal;
   an arithmetic section for storing a minimum value and a maximum value of the particular signal occurring until the end of said particular signal, and comparing a center amplitude calculated from the maximum value and the minimum value with a reference voltage to thereby output center voltage data; and
   a quartz oscillation section for controlling, based on said center voltage data, an oscillation frequency to be input to a mixer, which outputs the IF signal, such that a center voltage of an output of said low pass filter coincides with an optimal value.

2. A radio pager as claimed in claim 1, wherein said quartz oscillation section comprises a variable capacity diode for controlling the oscillation frequency in accordance with said center voltage data.

3. A radio pager comprising:
   a signal detecting section for detecting a particular signal contained in an IF signal output from a low pass filter to thereby recognize a start and an end of said particular signal;
   an arithmetic section for storing a minimum value and a maximum value of the particular signal occurring until the end of said particular signal, and comparing a center amplitude calculated from the maximum value and the minimum value with a reference voltage to thereby output center voltage data;
   a smoothing section for smoothing a voltage derived from said center voltage data output from said arithmetic section; and
   a quartz oscillation section for controlling, based on the voltage output from said smoothing section, an oscillation frequency to be input to a mixer, which outputs the IF signal, such that a center voltage of an output of said low pass filter coincides with an optimal value.

4. A radio pager as claimed in claim 3, wherein said quartz oscillation section comprises a variable capacity diode for controlling the oscillation frequency in accordance with said center voltage data.

5. A radio pager comprising:
   a signal detecting section for detecting a particular signal contained in an IF (Intermediate Frequency) signal output from a low pass filter to thereby recognize a start and an end of said particular signal;
   an arithmetic section for storing a minimum value and a maximum value of the particular signal occurring until the end of said particular signal, and comparing a center amplitude calculated from the maximum value and the minimum value with a reference voltage to thereby output center voltage data;
   a quartz oscillation section for controlling, based on said center voltage data, an oscillation frequency to be input to a mixer, which outputs the IF signal, such that a center voltage of an output of said low pass filter coincides with an optimal value; and
   a counting section for counting BS (Battery Saving) OFF states at a preselected timing, wherein when a count of the BS OFF states reaches a preselected count without the particular signal being detected, initial center voltage data stored in said arithmetic section beforehand is output.

6. A radio pager as claimed in claim 5, further including an FM demodulation circuit for converting the frequency of the IF signal to a corresponding DC voltage, and an analog to digital converter for converting the DC voltage of the FM demodulation circuit to a corresponding digital signal, and wherein the arithmetic section stores a minimum value and a maximum value of the corresponding digital signal.

7. A radio pager comprising:

a signal detecting section for detecting a particular signal contained in an IF signal output from a low pass filter to thereby recognize a start and an end of said particular signal;

an arithmetic section for storing a minimum value and a maximum value of the particular signal occurring until the end of said particular signal, and comparing a center amplitude calculated from the maximum value and the minimum value with a reference voltage to thereby output center voltage data;

a smoothing section for smoothing a voltage derived from said center voltage data output from said arithmetic section;

a quartz oscillation section for controlling, based on the voltage output from said smoothing section, an oscillation frequency to be input to a mixer, which outputs the IF signal, such that a center voltage of an output of said low pass filter coincides with an optimal value; and a counting section for counting BS OFF states at a preselected timing, wherein when a count of the BS OFF states reaches a preselected count without the particular signal being detected, initial center voltage data stored in said arithmetic section beforehand is output.

8. A radio pager as claimed in claim 7, further comprising an FM demodulation circuit for converting the frequency of the IF signal to a corresponding DC voltage, and an analog to digital converter for converting the DC voltage of the FM demodulation circuit to a corresponding digital signal, and wherein the section stores a minimum value and a maximum value of the corresponding digital signal.

* * * * *